(12) United States Patent
Senapati et al.

(10) Patent No.: US 12,424,550 B2
(45) Date of Patent: Sep. 23, 2025

(54) BURIED METAL SIGNAL RAIL FOR MEMORY ARRAYS

(71) Applicant: International Business Machines Corporation, Armonk, NY (US)

(72) Inventors: Biswanath Senapati, Mechanicville, NY (US); Seiji Munetoh, Tokyo (JP); Nicholas Anthony Lanzillo, Wynantskill, NY (US); Lawrence A. Clevenger, Saratoga Springs, NY (US); Geoffrey Burr, Cupertino, CA (US); Kohji Hosokawa, Ohtsu (JP)

(73) Assignee: International Business Machines Corporation, Armonk, NY (US)

( * ) Notice: Subject to any disclaimer, the term of this patent is extended or adjusted under 35 U.S.C. 154(b) by 502 days.

(21) Appl. No.: 17/903,342

(22) Filed: Sep. 6, 2022

(65) Prior Publication Data

US 2024/0079326 A1 Mar. 7, 2024

(51) Int. Cl.
*H01L 23/528* (2006.01)
*H10B 63/00* (2023.01)
*H10N 70/00* (2023.01)
*H10N 70/20* (2023.01)

(52) U.S. Cl.
CPC ......... *H01L 23/5286* (2013.01); *H10B 63/30* (2023.02); *H10B 63/80* (2023.02); *H10N 70/011* (2023.02); *H10N 70/231* (2023.02)

(58) Field of Classification Search
None
See application file for complete search history.

(56) References Cited

U.S. PATENT DOCUMENTS

| 6,355,950 | B1 | 3/2002 | Livengood |
| 7,772,631 | B2 | 8/2010 | Schloesser |
| 9,153,590 | B2 | 10/2015 | Lim |
| 9,331,062 | B1 | 5/2016 | Lane |
| 9,837,422 | B2 | 12/2017 | Kim |

(Continued)

FOREIGN PATENT DOCUMENTS

| CN | 114649285 A | 6/2022 |
| WO | 2021260377 A1 | 12/2021 |

OTHER PUBLICATIONS

R. Mathur et al., "Buried Interconnects for Sub-5 nm SRAM Design," in IEEE Transactions on Electron Devices, vol. 69, No. 3, pp. 1041-1047, Mar. 2022, doi: 10.1109/TED.2022.3143078.

(Continued)

*Primary Examiner* — Jack S Chen
(74) *Attorney, Agent, or Firm* — Kimberly Zillig; Otterstedt & Kammer PLLC

(57) ABSTRACT

An IC memory device includes a substrate and an array of memory cells on the substrate. Each memory cell includes at least one memory cell transistor in a layer of the device adjacent to the substrate. In the same layer, the device also includes a plurality of shunt transistors. The device also includes a buried metal signal rail, which is disposed between the array of memory cells and the plurality of shunt transistors in a buried layer that is embedded into the substrate below the transistors. The device also includes single-layer vias, which are in same layer as the transistors and electrically connect the memory cell transistors to the shunt transistors through the buried metal signal rail.

7 Claims, 7 Drawing Sheets

(56) References Cited

U.S. PATENT DOCUMENTS

| | | |
|---|---|---|
| 10,916,583 B2 | 2/2021 | Wang |
| 12,148,682 B2 * | 11/2024 | Senapati ........... H01L 21/76898 |
| 2008/0048333 A1 | 2/2008 | Seo |
| 2010/0252934 A1 | 10/2010 | Law |
| 2012/0299073 A1 | 11/2012 | Mikasa |
| 2015/0332966 A1 | 11/2015 | Maling |
| 2018/0145030 A1 | 5/2018 | Beyne |
| 2021/0202504 A1 | 7/2021 | Chang |
| 2021/0320122 A1 | 10/2021 | Zhang |
| 2024/0079326 A1 * | 3/2024 | Senapati ................ H10B 61/22 |

OTHER PUBLICATIONS

Authorized officer Zhang, Yue, China National Intellectual Property Administration. counterpart PCT application PCT/CN2023/117015 ISR & WO mailed on Nov. 16, 2023. pp. 7.

* cited by examiner

|  | Prior Art | Inventive structure (Assume Matched BPR Rs) | Inventive Structure (Assume 50% BPR Rs Reduction) |
|---|---|---|---|
| Via Contribution (Ohms) | 154.96 | 56 | 56 |
| Line Contribution (Ohms) | 30 | 30 | 15 |
| Grand Total (Ohms) | 184.96 | 86 | 71 |
| Reduction (%) |  | 53.50346021 | 61.6133218 |

FIG. 6

BURIED METAL SIGNAL RAIL FOR MEMORY ARRAYS

BACKGROUND

The present invention relates to the electrical, electronic, and computer arts, and more specifically, to fabrication of integrated circuit memory devices.

It is well known that integrated circuit memory devices incorporate arrays of memory cells that are addressed by word and bit lines (metal traces and vias), through which voltage/current can be applied to write and read individual cells. Generally, bit lines are connected from memory cell transistors (in the front-end-of-line layers) up through multi-level metal vias to the back-end-of-line layers, and then back down through more levels of vias to sense amplifiers that also are formed in the front-end-of-line layers. Significant $I^2R$ losses and latency are incurred in operation of conventional IC memory devices, due in part to the layout of the bit lines.

SUMMARY

Principles of the invention provide techniques for buried metal signal rail(s) for memory arrays.

In one aspect, an exemplary integrated circuit memory device includes a substrate and an array of memory cells that are disposed on the substrate. Each memory cell includes at least one memory cell transistor, which is disposed in a first layer of the device that is adjacent to a top side of the substrate. The device also includes a plurality of shunt transistors, each of which is disposed in the first layer. The device also includes a buried metal signal rail, which is disposed between the array of memory cells and the plurality of shunt transistors in a buried layer of the device that is embedded into the substrate below the first layer. The device also includes a first single-layer via, which is disposed in the first layer and electrically connects one of the memory cell transistors to the buried metal signal rail; and a second single-layer via, which is disposed in the first layer and electrically connects the buried metal signal rail to one of the plurality of shunt transistors.

According to another aspect, an exemplary method is provided for fabricating an integrated circuit memory device. The method includes: forming a memory cell transistor and a shunt transistor in a first layer of the device, wherein the first layer is adjacent to a substrate on a top side of the substrate. The method also includes forming a buried metal signal rail in a buried layer of the device that is embedded into the substrate between the memory cell transistor and the shunt transistor; and the method also includes forming a bit line that connects the memory cell transistor to the shunt transistor via the buried metal signal rail, such that the bit line is entirely contained within the first layer and the buried layer.

According to another aspect, in an integrated circuit memory device, a method includes transmitting a signal from a memory cell transistor that is disposed in a first layer of the device, wherein the first layer is adjacent to a top side of a substrate of the device, through a first single-layer via that is disposed in the first layer, to a buried metal signal rail that is disposed in a buried layer that is embedded into the substrate of the device.

In view of the foregoing, techniques of the present invention can provide substantial beneficial technical effects. For example, one or more embodiments provide one or more of:

Significant resistance reduction (~50-60%) of both via/metal stack(s) and line(s), leading to improvement of READ and WRITE operations, which enables larger memory book size.

Eliminating two of four vias in a unit cell of memory, saving ~0.56 $\mu m^2$ of the unit-cell footprint, which enables significant cell shrinkage.

Enables upper metal stack wire level(s) to be used for purposes other than memory access.

Heterogeneous integration of backside power network. Backside power networks do not necessarily require heterogeneous integration, though it is expected that backside power will provide a very attractive benefit for systems which are heterogeneously integrated.

Some embodiments may not have these potential advantages and these potential advantages are not necessarily required of all embodiments. These and other features and advantages of the present invention will become apparent from the following detailed description of illustrative embodiments thereof, which is to be read in connection with the accompanying drawings.

BRIEF DESCRIPTION OF THE DRAWINGS

FIG. 6 depicts, in tabular form, advantages of exemplary embodiments compared to the prior art.

DETAILED DESCRIPTION

Figure 1:
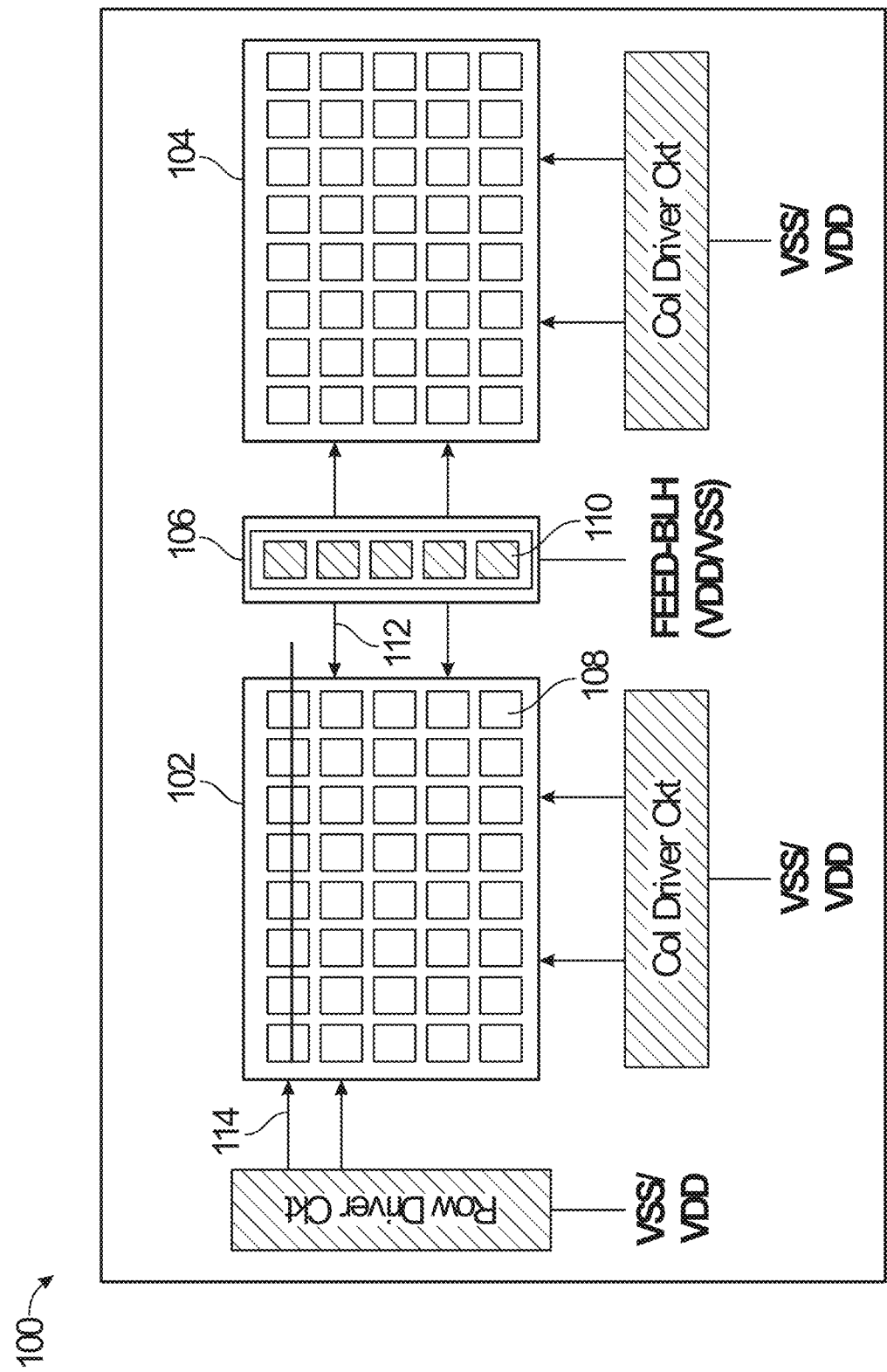
FIG. 1 depicts, in a schematic, an integrated circuit memory device, according to the prior art.

FIG. 1 depicts, in a schematic, an integrated circuit memory device 100, according to the prior art. The device 100 includes memory arrays 102, 104 and a sense amplifiers array 106. Each of the memory arrays 102, 104 includes a plurality of memory cells 108, and the sense amplifiers array 106 includes a plurality of sense amplifiers 110. Columns of the memory arrays 102, 104 are electrically connected to the sense amplifiers array 106 by bit lines 112. Word lines 114 are electrically connected to rows of the memory arrays 102, 104. As the ordinary skilled worker will appreciate, each memory cell 108 can be addressed by its combination of word line and bit line. Column drivers supply source voltage VSS or drain voltage VDD to the memory cells. A signal FEED_BLH is supplied through the sense amplifiers array 106 to bit lines 112 that supply the signal to both subsections or segments of the overall array 102, 104.

Figure 2:
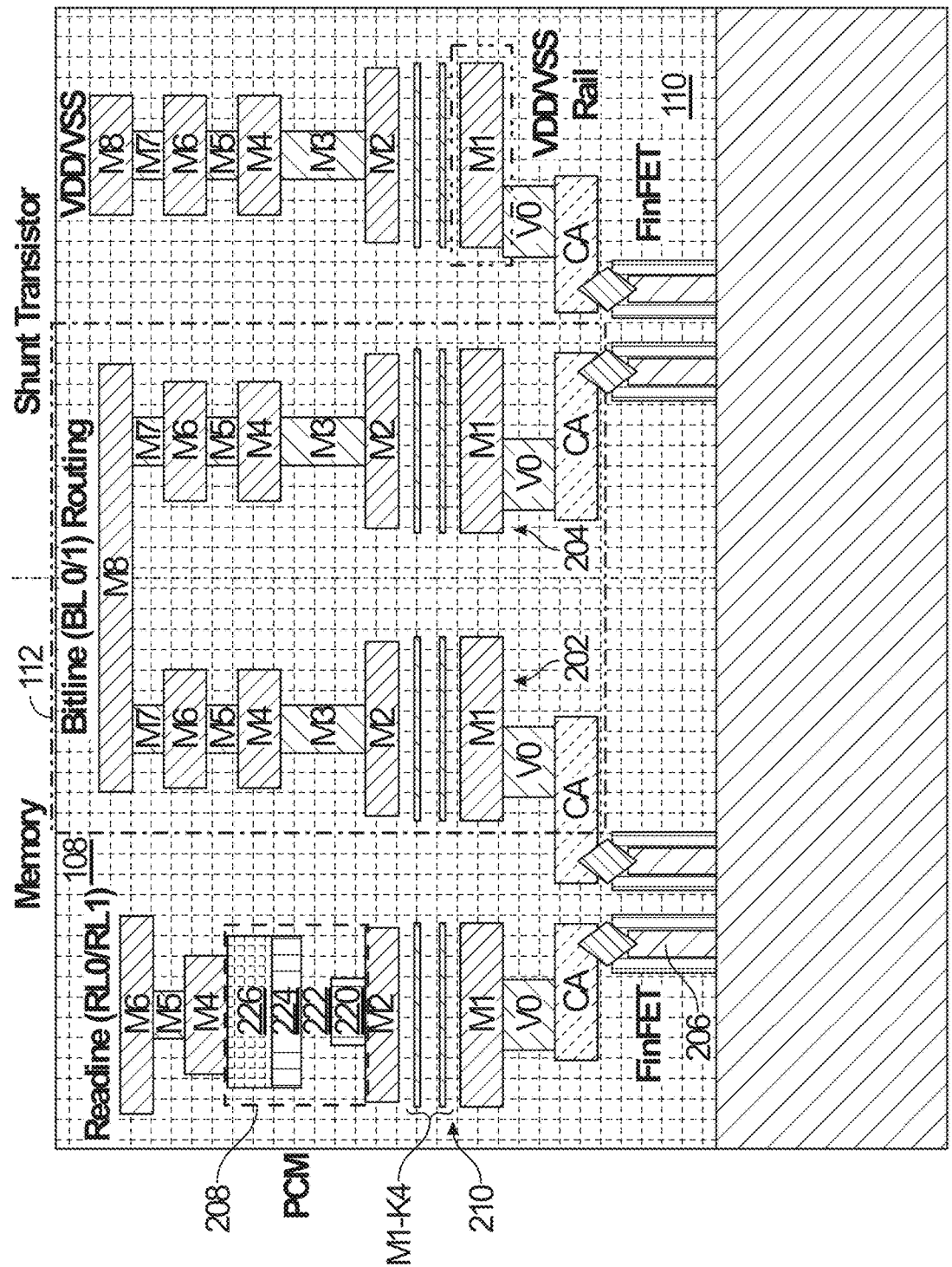
FIG. 2 depicts, in a schematic, a memory cell and a shunt transistor, which are connected by a bit line that includes multi-layer vias, according to the prior art.

FIG. 2 depicts, in a schematic, a memory cell 108 and a part of a sense amplifier 110, which are connected by a bit line 112 that includes multi-layer vias 202, 204, according to the prior art. The skilled worker will be familiar with specific layers of metal that compose the multi-layer vias, e.g., M1, M2, M3, M4, M5, M6, M7, M8, which are not further described in detail. In one or more embodiments, the memory cell 108 and the part of the sense amplifier 110 each include FinFETs (fin-type field-effect transistors) 206, and the bit line 112 connects these transistors. In one or more embodiments, the memory cell 108 includes a memory module 208, e.g., phase change memory, magnetoresistive random access memory, or resistive random-access memory.

In one or more embodiments, the memory 208 is a phase change memory module, which includes a bottom electrode 220. a heater element 222, an optional metal level 224, and a phase change material 226 (e.g., a chalcogenide material), with a top electrode indicated at M4.

The choice of memory modules is not limited to resistive memory; embodiments of the invention, which relates specifically to structures for communication between the memory cell 108 and the part of the sense amplifier 110 of a sense amplifier, equally are applicable to static random-access memory (SRAM) or dynamic random-access memory (DRAM). In one or more embodiments, the memory cell 108 (like the multi-layer vias 202, 204) includes multiple layers of intermediate metal 210.

Figure 3:
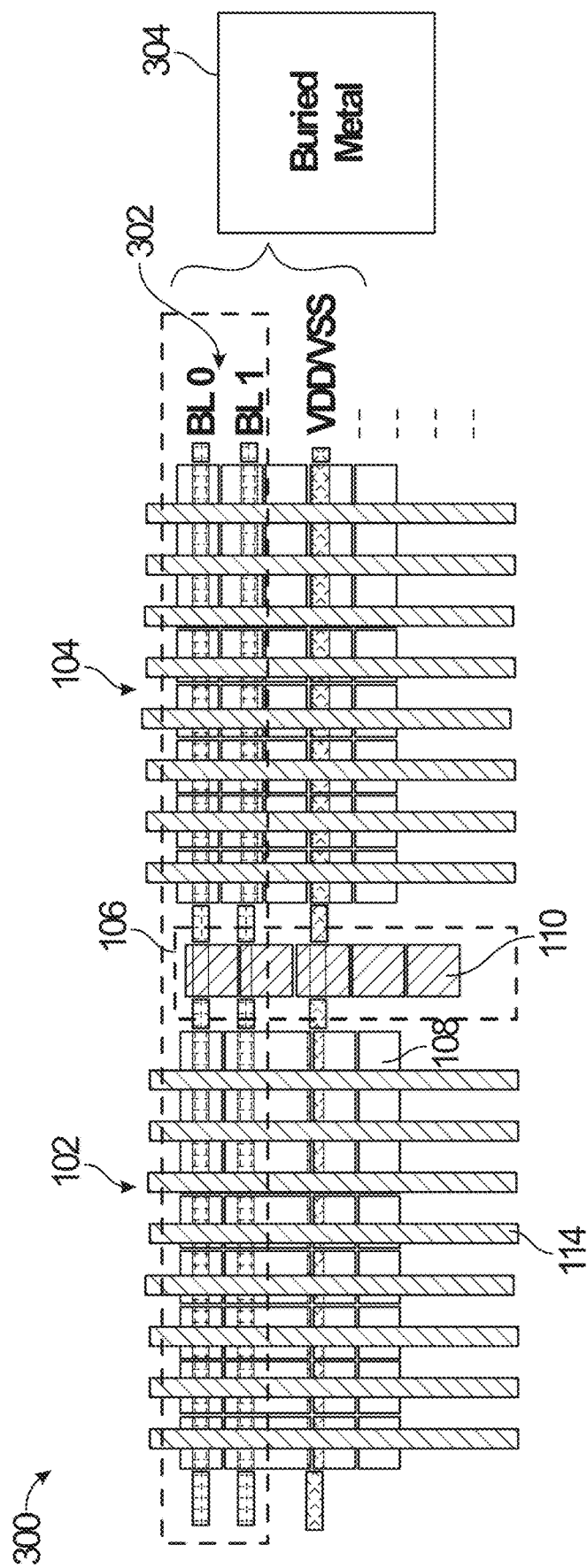
FIG. 3 depicts, in a schematic, an integrated circuit memory device that incorporates buried metal routing, according to exemplary embodiments.

FIG. 3 depicts, in a schematic, an integrated circuit memory device 300 that incorporates buried metal routing 304, according to exemplary embodiments. The device 300 includes memory arrays 102, 104 and a sense amplifiers array 106. Each of the memory arrays 102, 104 includes a plurality of memory cells 108, and the sense amplifiers array 106 includes a plurality of sense amplifiers 110. Columns of the memory arrays 102, 104 are electrically connected to the sense amplifiers array 106 by bit lines 302, which are implemented in the buried metal signal rail 304. Word lines 114 are electrically connected to rows of the memory arrays 102, 104. As the ordinary skilled worker will appreciate, each memory cell 108 can be addressed by its combination of word line and bit line.

A signal rail may be distinguished from a power rail in that a signal rail connects to a signal source that provides a time-varying signal, while a power rail connects to a power source or ground. Signal paths connect the source of one device with the gate of another device, while power rails are connected to a global power distribution network (or "power grid") which in turn connects to many, many devices. Note that a power rail can carry DC and can also have a time-dependent current; for instance, if part of a logic block is "power gated" in which case the power is temporarily withheld from that segment of the chip. Power rails can thus, generally carry both DC and time-dependent current.

Figure 4:
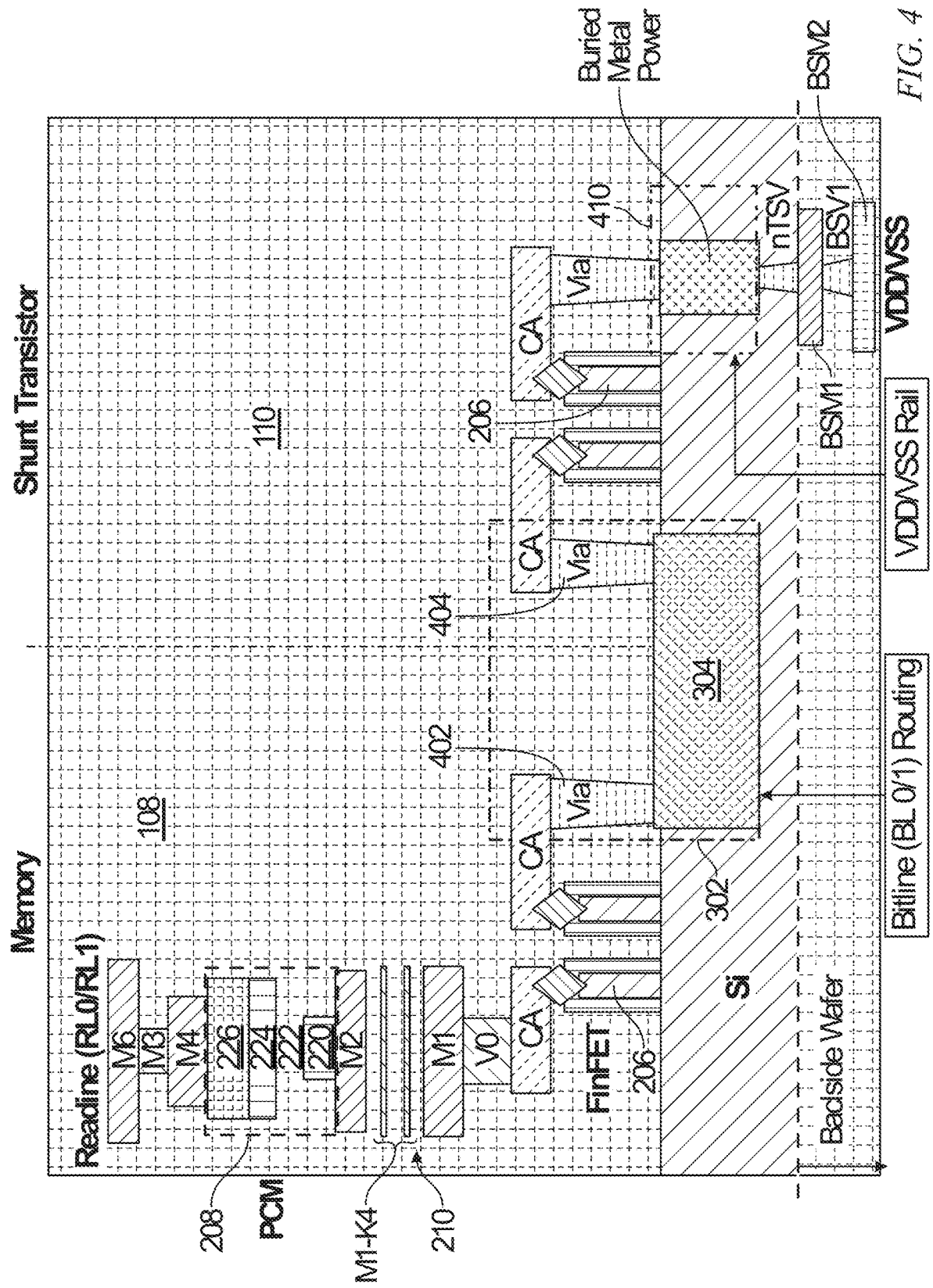
FIG. 4 depicts, in a schematic, a memory cell and a shunt transistor, which are connected by a buried metal signal rail, according to exemplary embodiments.

FIG. 4 depicts, in a schematic, a memory cell 108 and a part of a sense amplifier 110, which are connected by the bit line 302 that includes the buried metal signal rail 304 and single-layer vias 402, 404, according to exemplary embodiments. In one or more embodiments, the vias 402 and 404 are formed from the top side of the chip and typically have a size in the range of, for example, 5-25 nm. They can be formed from metals such as Co, Ru, W, Mo or anything else that can withstand the high thermal budget (~1000K) of device processing. The height of these vias could be in the range of, for example, 20-100 nm. In one or more embodiments, the memory cell 108 and the part of the sense amplifier 110 each include FinFETs (fin-type field-effect transistors) 206. In one or more embodiments, the memory cell 108 includes a memory module 208, e.g., phase change memory, magnetoresistive random access memory, or resistive random-access memory. The choice of memory modules is not limited to resistive memory. Embodiments of the invention, which relates specifically to structures for communication between the memory cell 108 and the sense amplifier 110, equally are applicable to other types of memory cell, e.g., static random-access memory (SRAM) or dynamic random-access memory (DRAM). The structure shown in FIG. 4 also includes a buried metal power rail 410, which is electrically connected to one of the transistors 206 in the sense amplifier 110. In one or more embodiments, the buried metal power rail 410 is adjacent to the buried metal signal rail 304.

Figure 5A:
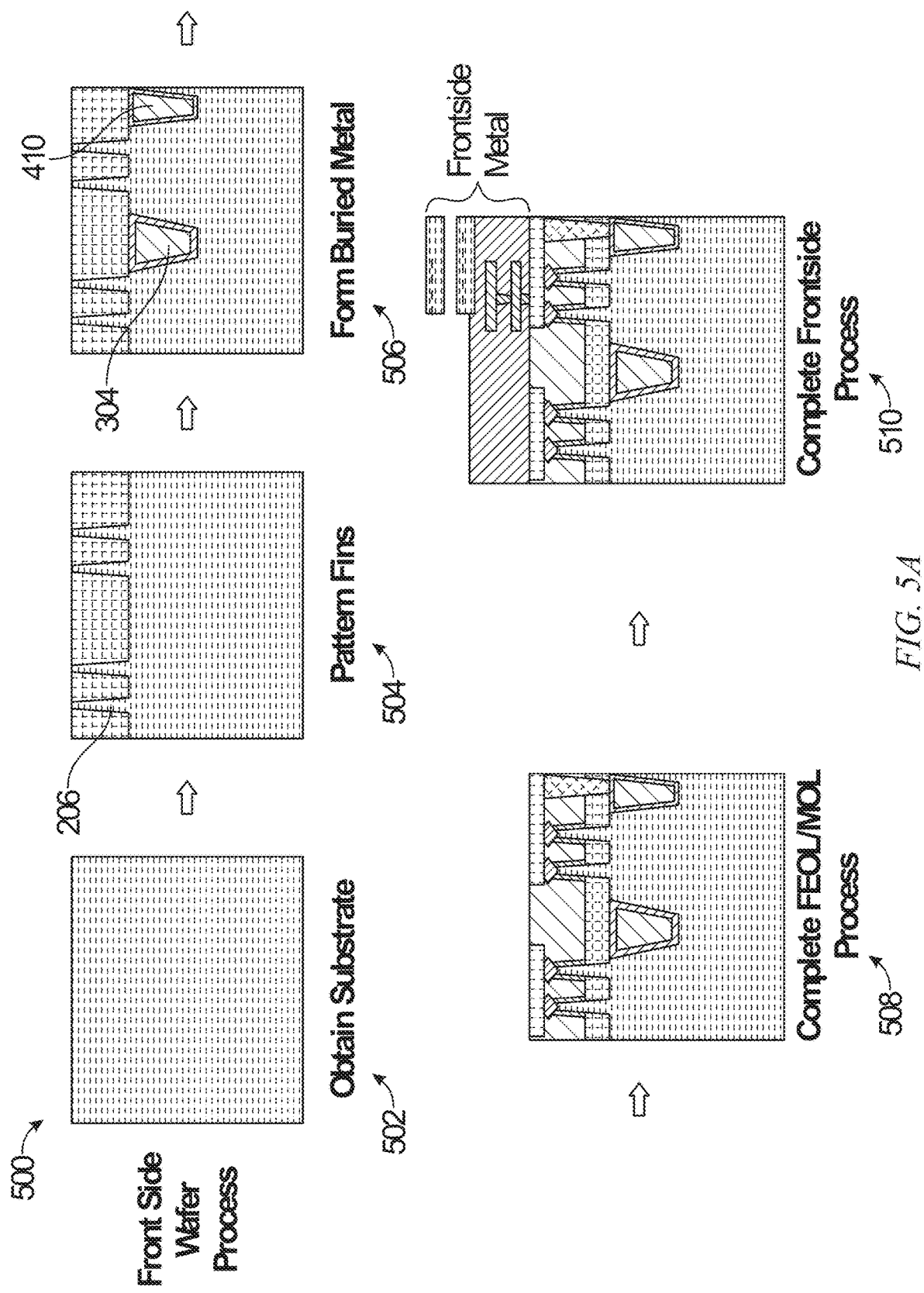
FIG. 5A and FIG. 5B depict, in schematics, steps of a method for making the integrated circuit memory device that is shown in FIG. 3 and FIG. 4, according to exemplary embodiments.
Figure 5B:
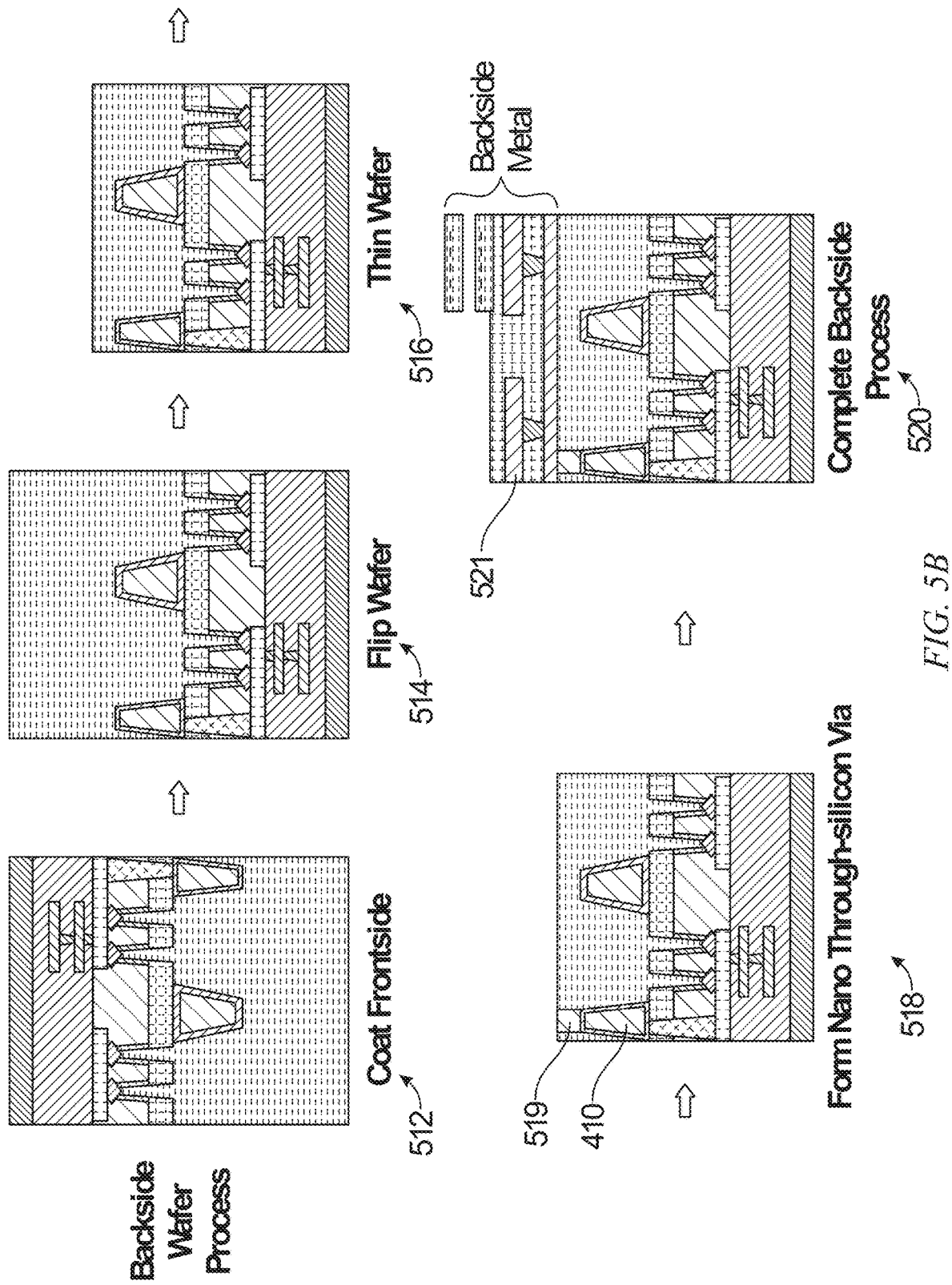

FIG. 5A and FIG. 5B depict, in schematics, selected steps of a method 500 for making the integrated circuit memory device that is shown in FIG. 3 and FIG. 4. At 502, obtain a starting substrate, e.g., silicon. At 504, pattern fins 206 and deposit interlayer dielectric (e.g., an oxide such as $SiO_2$, not separately numbered) around them, in a manner known by the ordinary skilled worker. At 506, form the buried metal signal rail 304 and the buried metal power rail 410. Each of the buried rails has a liner and also has a conductive filler (not separately numbered), as will be familiar to the skilled worker.

Semiconductor device manufacturing includes various steps of device patterning processes. For example, the manufacturing of a semiconductor chip may start with, for example, a plurality of CAD (computer aided design) generated device patterns, which is then followed by effort to replicate these device patterns in a substrate. The replication process may involve the use of various exposing techniques and a variety of subtractive (etching) and/or additive (deposition) material processing procedures.

As an exemplary subtractive process, in a photolithographic process, a layer of photo-resist material may first be applied on top of a substrate, and then be exposed selectively according to a pre-determined device pattern or patterns. Portions of the photo-resist that are exposed to light or other ionizing radiation (e.g., ultraviolet, electron beams, X-rays, etc.) may experience some changes in their solubility to certain solutions. The photo-resist may then be developed in a developer solution, thereby removing the non-irradiated (in a negative resist) or irradiated (in a positive resist) portions of the resist layer, to create a photo-resist pattern or photo-mask. The photo-resist pattern or photo-mask may subsequently be copied or transferred to the substrate underneath the photo-resist pattern.

Various structures that are described herein, e.g., source/drain structures, may be epitaxially grown. "Epitaxy" or "epitaxial growth," as used herein, refers to a process by which a layer of single-crystal or large-grain polycrystalline material is formed on an existing material with similar crystalline properties. One feature of epitaxy is that this process causes the crystallographic structure of the existing substrate or seed layer (including any defects therein) to be reproduced in the epitaxially grown material. Epitaxial growth can include heteroepitaxy (i.e., growing a material with a different composition from its underlying layer) or homoepitaxy (i.e., growing a material which includes the same composition as its underlying layer). Heteroepitaxy can introduce strain in the epitaxially grown material, as its crystal structure may be distorted to match that of the underlying layer. In certain applications, such strain may be desirable. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material may have the same crystalline characteristics as the deposition surface on which it may be formed. For example, an epitaxial semiconductor material deposited on a {100} crystal surface may take on a {100} orientation. In some embodiments, epitaxial growth and/or deposition processes may be selective to forming on semiconductor surfaces, and may not deposit material on dielectric surfaces, such as silicon dioxide or silicon nitride surfaces.

A number of different precursors may be used for the epitaxial deposition of the in situ doped semiconductor material. In some embodiments, the gas source for the deposition of an epitaxially formed in situ doped semiconductor material may include silicon (Si) deposited from silane, disilane, trisilane, tetrasilane, hexachlorodisilane, tetrachlorosilane, dichlorosilane, trichlorosilane, disilane and combinations thereof. In other examples, when the in situ doped semiconductor material includes germanium, a germanium gas source may be selected from the group consisting of germane, digermane, halogermane, dichlorogermane, trichlorogermane, tetrachlorogermane and combinations thereof. Examples of other epitaxial growth processes that can be employed in growing semiconductor layers described herein include rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE).

By "in-situ" it is meant that the dopant that dictates the conductivity type of doped layer is introduced during the process step, for example epitaxial deposition, that forms the doped layer. The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed.

At 508, complete a front-end-of-line process and a middle-of-line process. The front-end-of-line process forms transistors, diodes, or other active elements, while the middle-of-line process forms conductive traces and vias that interconnect the active elements. The elements added in step 508 include the transistor devices (including source, drain, channel, gate, etc.) and the "middle-of-line" electrical connections between the transistors and the interconnects in the BEOL. These connections include gate connections and source/drain connections. These electrical connections can be embedded in an oxide material (such as $SiO_2$ or the like) and can include a dielectric cap (SiN as an example) on top of them. At 510, complete a frontside process for back-end-of-line layers (BEOL). Step 510 includes the formation of all BEOL metal levels. To form a single metal level, low-k dielectric is deposited and then etched to form openings. Those openings are filled with metal (e.g., Cu) and then chemically-mechanically polished (CMP) to remove excess metal. Then, everything is covered with a dielectric cap material (e.g., SiN). This process is repeated for each metal level formed subsequently on top of the previous metal level. A chip can have, for example, anywhere from 10-20 total metal levels, with dimensions increasing going from the bottom to the top metal level. At 512, coat the frontside of the wafer in preparation for backside processes. In one or more embodiments, the wafer can be coated with a thick oxide or nitride-based material to protect the front side of the wafer during subsequent processing. At 514, flip the wafer.

At 516, thin the wafer. Those skilled in the art employ varied techniques to remove material at various stages of creating a semiconductor structure. As used herein, these processes are referred to generically as "etching". For example, etching includes techniques of wet etching, dry etching, chemical oxide removal (COR) etching, and reactive ion etching (RIE), which are all known techniques to remove select material(s) when forming a semiconductor structure. The Standard Clean 1 (SC1) contains a strong base, typically ammonium hydroxide, and hydrogen peroxide. The SC2 contains a strong acid such as hydrochloric acid and hydrogen peroxide. The techniques and application of etching is well understood by those skilled in the art and, as such, a more detailed description of such processes is not presented herein.

Another mode of material removal is chemical mechanical planarization (CMP), which is what could, in one or more embodiments, be employed for thinning the wafer at step 516.

At 518, form a nano through-silicon via (TSV) 519 to the buried metal power rail 410. An etch and fill process, e.g., a "Bosch etch," may be used to make an opening and then fill the opening with metal, such as copper, in order to form the nano TSV. At 520, complete a backside metal process that connects the buried metal power rail 410 with a backside power rail 521. Step 520 can be carried out, for example, in the same manner as step 510, except now on the backside of the wafer instead of the front side. Several levels of interconnect wiring can be formed using the same steps described above (dielectric deposition, etching, metal fill, CMP, dielectric cap.)

The steps shown in FIG. 5 are not necessarily the only steps of the method 500, which may comprise additional detail and intermediate steps that the ordinary skilled worker will apprehend in view of this disclosure.

FIG. 6 depicts, in tabular form, advantages of exemplary embodiments compared to the prior art. Notably, selected embodiments of the inventive structure reduce bit line resistance by 53%-62% compared to the prior art. These percentages of improvement are not necessarily present in all embodiments.

Given the discussion thus far, it will be appreciated that, in general terms, an exemplary integrated circuit memory device includes a substrate ("Si" in FIG. 4); an array of memory cells (e.g., 108) that are disposed on the substrate, wherein each memory cell comprises at least one memory cell transistor 206, which is disposed in a first layer of the device that is adjacent to a top side of the substrate. This first layer typically is formed by front-end-of-line (FEOL) processes, e.g., at step 504 and step 508 of FIG. 5A. The device also includes a plurality of shunt transistors, e.g., 110, each of which is disposed in the first layer. The device also includes a buried metal signal rail 304, which is disposed between the array of memory cells and the plurality of shunt transistors in a buried layer of the device that is embedded into the substrate below the first layer. The device also includes a first single-layer via 402, which is disposed in the first layer and electrically connects one of the memory cell transistors to the buried metal signal rail; and a second single-layer via 404, which is disposed in the first layer and electrically connects the buried metal signal rail to one of the plurality of shunt transistors.

In one or more embodiments, at least one of the memory cells includes a resistive memory element that is disposed in a second layer of the device that is adjacent to a top side of the first layer, i.e., a top side of the first layer that is opposite from the substrate. In one or more embodiments, this second layer can be formed as part of a middle-of-line (MOL) process, i.e., step 508 of FIG. 5A.

In one or more embodiments, at least one of the memory cell transistors is a fin-type field effect transistor (FinFET). In one or more embodiments, at least one of the shunt transistors is a fin-type field effect transistor (FinFET).

In one or more embodiments, the device also includes a second array of memory cells (e.g., 102 and 104 in FIG. 3) and a second buried metal signal rail (e.g., BL0 and BL1 in FIG. 3), and the plurality of shunt transistors, the buried metal signal rail, and the second buried metal signal rail form a bit line bus that interconnects the array of memory cells with the second array of memory cells.

In one or more embodiments, the device also includes a buried metal power rail 410, which is adjacent to the buried metal signal rail in the buried layer and is adjacent to one of the plurality of shunt transistors in the first layer.

In one or more embodiments, the device also includes a backside via 521, which is electrically connected to the buried metal power rail and extends from the buried layer to a bottom side of the substrate, wherein the bottom side of the substrate is opposite from the first layer.

According to another aspect, an exemplary method 500 is provided for fabricating an integrated circuit memory device. The method includes: at 504 and 508, forming a memory cell transistor and a shunt transistor in a first layer of the device, wherein the first layer is adjacent to a substrate on a top side of the substrate. The method also includes, at 506, forming a buried metal signal rail in a buried layer of the device that is embedded into the substrate between the memory cell transistor and the shunt transistor; and the method also includes, at 508, forming a bit line that connects the memory cell transistor to the shunt transistor via the buried metal signal rail, such that the bit line is entirely contained within the first layer and the buried layer.

In one or more embodiments, forming the bit line includes forming a first single-layer via that electrically connects the memory cell transistor to the buried metal signal rail; and forming a second single-layer via from the buried metal signal rail to the shunt transistor.

Some embodiments of the method also include, at 506, forming a buried metal power rail adjacent to the buried metal signal rail and adjacent to the shunt transistor.

One or more embodiments also include, at 518, forming a backside via that is electrically connected to the buried metal power rail.

In one or more embodiments, forming at least one of the memory cell transistors comprises forming a FinFET. In one or more embodiments, forming at least one of the shunt transistors comprises forming a FinFET.

According to another aspect, in an integrated circuit memory device, a method includes transmitting a signal from a memory cell transistor that is disposed in a first layer of the device, wherein the first layer is adjacent to a top side of a substrate of the device, through a first single-layer via that is disposed in the first layer, to a buried metal signal rail that is disposed in a buried layer that is embedded into the substrate of the device. In one or more embodiments, the method also includes transmitting the signal from the buried metal signal rail through a second single-layer via to a shunt transistor of a sense amplifier, wherein the shunt transistor also is disposed in the first layer.

Although the overall fabrication method and the structures formed thereby are novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example: James D. Plummer et al., Silicon VLSI Technology: Fundamentals, Practice, and Modeling 1st Edition, Prentice Hall, 2001 and P. H. Holloway et al., Handbook of Compound Semiconductors: Growth, Processing, Characterization, and Devices, Cambridge University Press, 2008, which are both hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices may not be explicitly shown in a given figure for ease of explanation. This does not imply that the semiconductor layer(s) not explicitly shown are omitted in the actual integrated circuit device.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:
1. An integrated circuit memory device comprising:
 a substrate;
 an array of memory cells that are disposed on the substrate, wherein each memory cell comprises at least one memory cell transistor, which is disposed in a first layer of the device that is adjacent to a top side of the substrate;
 a plurality of shunt transistors, each of which is disposed in the first layer;
 a buried metal signal rail, which is disposed between the array of memory cells and the plurality of shunt transistors in a buried layer of the device that is embedded into the substrate below the first layer;
 a first single-layer via, which is disposed in the first layer and electrically connects one of the memory cell transistors to the buried metal signal rail; and
 a second single-layer via, which is disposed in the first layer and electrically connects the buried metal signal rail to one of the plurality of shunt transistors.
2. The device of claim 1, wherein at least one of the memory cells comprises a resistive memory element that is disposed in a second layer of the device that is adjacent to a top side of the first layer, wherein the top side of the first layer is opposite from the substrate.

3. The device of claim 1, wherein at least one of the memory cell transistors is a fin-type field effect transistor (FinFET).

4. The device of claim 1, wherein at least one of the shunt transistors is a fin-type field effect transistor (FinFET).

5. The device of claim 1, further comprising a second array of memory cells and a second buried metal signal rail, wherein the plurality of shunt transistors, the buried metal signal rail, and the second buried metal signal rail comprise a bit line bus that interconnects the array of memory cells with the second array of memory cells.

6. The device of claim 1, further comprising a buried metal power rail, which is adjacent to the buried metal signal rail in the buried layer and is adjacent to one of the plurality of shunt transistors in the first layer.

7. The device of claim 6, further comprising a backside via, which is electrically connected to the buried metal power rail and extends from the buried layer to a bottom side of the substrate, wherein the bottom side of the substrate is opposite from the first layer.

* * * * *